(12) United States Patent
Steimle et al.

(10) Patent No.: US 9,463,976 B2
(45) Date of Patent: Oct. 11, 2016

(54) MEMS FABRICATION PROCESS WITH TWO CAVITIES OPERATING AT DIFFERENT PRESSURES

(71) Applicants: Robert F. Steimle, Austin, TX (US); Paul M. Winebarger, Austin, TX (US)

(72) Inventors: Robert F. Steimle, Austin, TX (US); Paul M. Winebarger, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 86 days.

(21) Appl. No.: 14/317,101

(22) Filed: Jun. 27, 2014

(65) Prior Publication Data

US 2015/0375995 A1 Dec. 31, 2015

(51) Int. Cl.
*B81C 1/00* (2006.01)

(52) U.S. Cl.
CPC ....... *B81C 1/00238* (2013.01); *B81C 1/00246* (2013.01); *B81C 1/00253* (2013.01); *B81B 2201/0235* (2013.01); *B81B 2201/0242* (2013.01)

(58) Field of Classification Search
CPC ..... H01L 23/10; H01L 41/083; H01L 41/25; B81C 1/00246; B81C 1/00253; B81C 1/00238
See application file for complete search history.

(56) References Cited

U.S. PATENT DOCUMENTS

| | | | |
|---|---|---|---|
| 7,322,242 B2 * | 1/2008 | Merassi | B81B 7/0048 257/734 |
| 7,739,900 B2 | 6/2010 | Reinert et al. | |
| 7,859,093 B2 * | 12/2010 | Funk | G01P 1/023 257/414 |
| 7,919,362 B2 | 4/2011 | Bolis | |
| 8,476,809 B2 | 7/2013 | Chen et al. | |
| 8,546,928 B2 | 10/2013 | Merz et al. | |
| 8,587,183 B2 | 11/2013 | Chen et al. | |
| 8,633,049 B2 | 1/2014 | Nasiri et al. | |
| 9,021,880 B2 * | 5/2015 | Stephanou | G01C 19/5712 73/510 |
| 9,032,796 B2 * | 5/2015 | Stephanou | G01C 19/5712 73/510 |
| 9,108,841 B1 * | 8/2015 | Bowles | B81C 3/001 |
| 2008/0141759 A1 | 6/2008 | Reinert et al. | |
| 2008/0180890 A1 | 7/2008 | Bolis | |
| 2010/0025845 A1 | 2/2010 | Merz et al. | |
| 2010/0193884 A1 | 8/2010 | Park et al. | |
| 2012/0112293 A1 | 5/2012 | Pornin et al. | |
| 2012/0161255 A1 | 6/2012 | Gabert et al. | |
| 2012/0280594 A1 | 11/2012 | Chen et al. | |
| 2013/0012078 A1 | 1/2013 | Fischer et al. | |
| 2013/0140651 A1 | 6/2013 | Chen et al. | |
| 2013/0140944 A1 | 6/2013 | Chen et al. | |
| 2013/0140958 A1 | 6/2013 | Chen et al. | |
| 2014/0005484 A1 | 1/2014 | Charles | |
| 2014/0005485 A1 | 1/2014 | Tesar et al. | |
| 2014/0005486 A1 | 1/2014 | Charles | |
| 2014/0005487 A1 | 1/2014 | Tesar | |
| 2014/0005488 A1 | 1/2014 | Charles et al. | |
| 2014/0005489 A1 | 1/2014 | Charles | |
| 2014/0005555 A1 | 1/2014 | Tesar | |
| 2014/0008739 A1 | 1/2014 | Karlin et al. | |
| 2014/0038364 A1 | 2/2014 | Nicolas et al. | |
| 2014/0217566 A1 * | 8/2014 | Goida | H01L 23/04 257/676 |

* cited by examiner

*Primary Examiner* — Evan Pert

(57) ABSTRACT

A method and apparatus are described for fabricating a high aspect ratio MEMS sensor device having multiple vertically-stacked inertial transducer elements (101B, 110D) formed in different layers of a multi-layer semiconductor structure (100) and one or more cap devices (200, 300) bonded to the multi-layer semiconductor structure (100) to protect any exposed inertial transducer element from ambient environmental conditions.

20 Claims, 6 Drawing Sheets

MEMS FABRICATION PROCESS WITH TWO CAVITIES OPERATING AT DIFFERENT PRESSURES

BACKGROUND OF THE INVENTION

1. Field of the Invention

The present invention is directed in general to the field of semiconductor devices. In one aspect, the present invention relates to MEMS devices and methods for fabricating MEMS devices.

2. Description of the Related Art

Micro-Electro-Mechanical Systems (MEMS) technology is increasingly used to integrate mechanical elements, sensors, actuators, and electronics on a common silicon substrate through microfabrication technology. For example, inertial sensors may be formed with MEMS devices on an integrated circuit wafer substrate to form various applications, such accelerometers for measuring linear acceleration, gyroscopes for measuring angular velocity, optical devices, pressure sensors, switches, and so forth. A conventional MEMS device typically includes a moveable element, such as a proof mass, diaphragm, mirror, and the like that is flexible or movable, and is attached to the rest of the device. Relative motion between this movable element and the rest of the device is driven by actuators and/or sensed by sensors in various ways, depending on device design. With existing semiconductor processing techniques, there are challenges with integrating multiple MEMS sensors onto a single integrated circuit device, such as when different MEMS sensors operating at different cavity pressures are separately fabricated and assembled into a single substrate layer, resulting in a combined sensor circuit having a large footprint and potentially conflicting processing steps. For example, the bonding techniques used to form a good vacuum for a first sensor (e.g., gyroscope sensor) may be unsuitable for another sensor (e.g., an overdamped accelerometer) formed on the device substrate. In addition, the getter materials used to form a vacuum in a gyroscope wafer cavity can impose additional expense as well as processing constraints for the formation of other MEMS sensors due to the temperature limitations of such getter materials. Conversely, the anti-stiction coatings used in forming accelerometer sensors can interfere with the eutectic bonding process used to form gyrometer sensors. As a result, the existing design, operation, and manufacturability of integrated circuit MEMS sensors are extremely difficult to implement at a practical level.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

Figure 1:
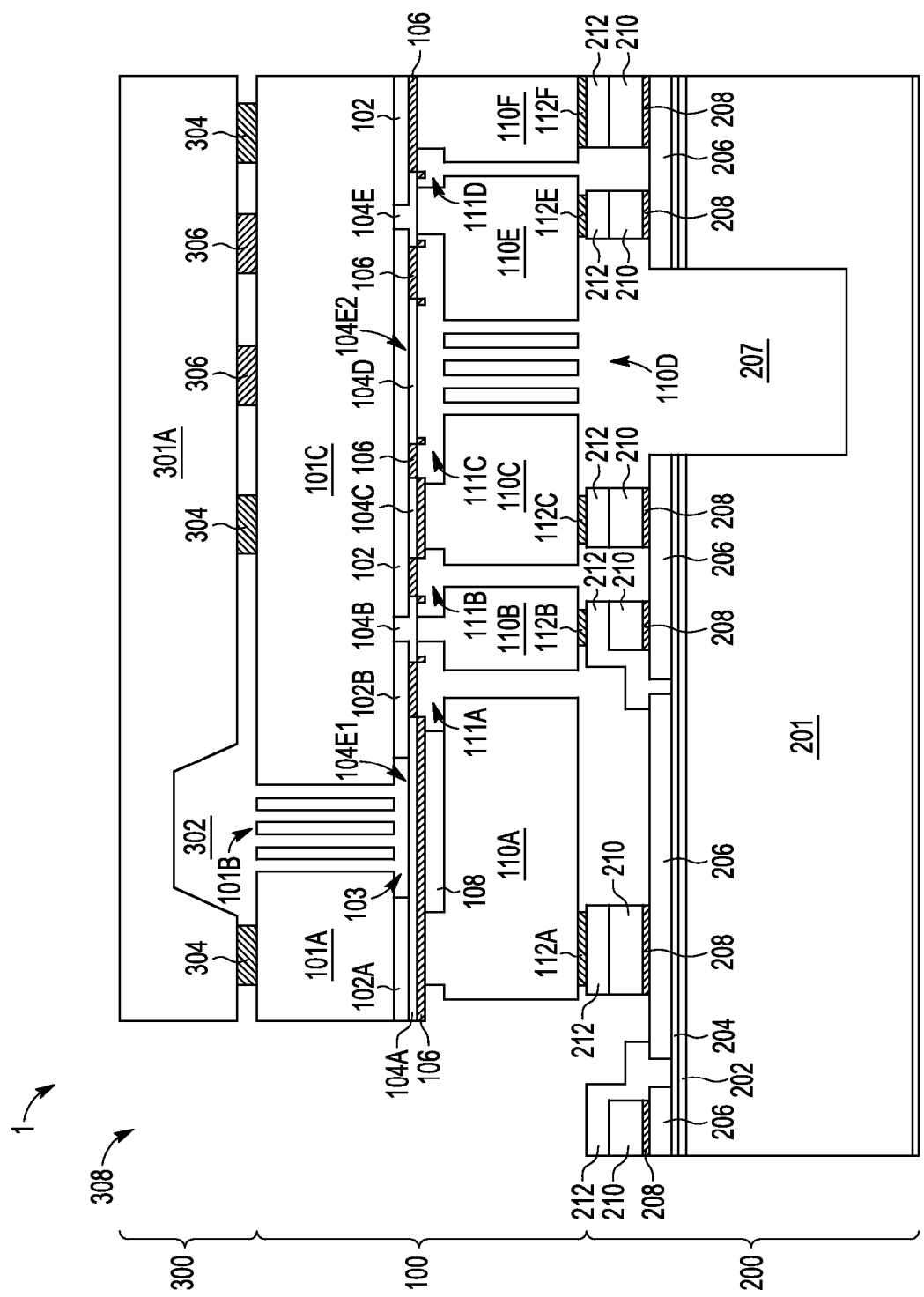
FIG. 1 is a simplified cross section view of a multi-sensor MEMS device which includes a plurality of MEMS transducer elements integrated with first and second MEMS device wafers that are bonded together using metal compression bonding and capped with a pair of cap wafer devices.

A method and apparatus are described for fabricating a plurality of high aspect ratio transducers in a vertically stacked MEMS device wafer assembly by applying separate transducer etch processes to different assembly layers that may be attached into a single MEMS device wafer assembly using different wafer bonding techniques. In selected embodiments, a first MEMS device wafer having a deposited polycrystalline semiconductor layer and a first monocrystalline substrate is subjected to a first transducer etch process of the poly layer to form interconnects, bond and sealing ring structures, and the movable mass used for a first MEMS sensor (e.g., a gyroscope sensor mass). As will be appreciated, additional processing may be used to form one or more sensor electrodes, driver electrodes, and/or interconnect routing in the first MEMS device. In addition, a first patterned conductor layer (e.g., germanium) may be formed on the first MEMS device wafer for use in forming a bond (e.g., eutectic bond) to a first cap wafer device having a vacuum cavity aligned with the first MEMS sensor and a second patterned conductor layer (e.g., aluminum) aligned with the first patterned conductor layer.

In selected embodiments, the first cap wafer device may be implemented as an application specific integrated circuit for driving and sensing motion of the subsequently-formed MEMS sensor elements. For example, the second patterned conductor layer on the first cap wafer may be formed on a first surface of a first cap wafer to define aligned interconnect, bond, and seal ring structures between the first MEMS device wafer and first cap wafer that can be bonded together using metal compression bonding techniques. In this way, the first MEMS wafer device and first cap wafer device may be bonded together in a vacuum environment to form a eutectic seal bond which preserves the vacuum at the first MEMS sensor.

After bonding the first MEMS wafer device to the first cap wafer device, the exposed first monocrystalline substrate layer of the first MEMS device wafer may be thinned and etched with a second, separate transducer etch process to form the movable mass for a second MEMS sensor (e.g., an accelerometer sensor mass) which may be aligned with a wafer cavity formed in a second cap wafer device. In addition, a second, separate transducer etch process is applied to the monocrystalline semiconductor layer of the first MEMS device wafer to form the movable mass for a second MEMS sensor (e.g., an accelerometer sensor mass) which may be aligned with a wafer cavity formed in a second cap wafer device. By patterning one or more patterned frit bond or conductor layers (e.g., aluminum) on the exposed surface of the (thinned) monocrystalline semiconductor layer, the second cap wafer may be bonded to the first MEMS wafer device using a lower temperature bonding technique or other metal thermocompression or a eutectic bonding technique, thereby enclosing the second MEMS sensor. In this way, a plurality of MEMS sensor elements (such as an accelerometer or gyroscope) may be fabricated in different layers of the vertically stacked MEMS device wafer assembly, including an hermetically sealed high vacuum gyroscope sensor and a non-vacuum MEMS sensor, each of which is sandwiched in between and protected by a corresponding cap wafer device.

Referring now to FIG. 1, there is shown a simplified cross section view of a vertically stacked MEMS device wafer assembly 1 that includes a plurality of sensors. The first depicted sensor may be formed as a gyro sensor formed with a high aspect ratio polycrystalline MEMS proof mass 110D and one or more out-of-plane sensing electrodes 104E2 that are integrated with the first MEMS wafer device 100 and first cap wafer structure 200, respectively, where the first MEMS wafer device 100 and first cap wafer structure 200 are bonded together using metal compression bonding techniques. The second depicted sensor may be formed as a linear accelerometer sensor formed with a high aspect ratio monocrystalline MEMS proof mass 101B and one or more out-of-plane sensing electrodes 104E1 that are integrated with the first MEMS wafer device 100 and second cap wafer structure 300, respectively, where the first MEMS wafer device 100 and second cap wafer structure 300 are bonded together using a separate bonding technique, such as a low temperature frit bond. As will be appreciated, the representative sensors shown as being formed in the different layers 110, 101 represent any type of MEMS sensor (such as an accelerometer, a gyroscope, etc.), and any number of MEMS sensor devices could be formed in either or both of the layers 110, 101.

As formed, the first depicted sensor may include a polycrystalline MEMS proof mass 110D that is formed over a high vacuum cavity 207 in the first cap wafer structure 200 and suspended below the monocrystalline semiconductor wafer substrate 101 by, for example, one or more suspension springs (not shown). In addition, the first depicted sensor includes one or more structural connection elements 110A-C, 110E-F formed in the polycrystalline semiconductor wafer layer 110 which are fixedly coupled to the first cap wafer structure 200 (by the metal bond anchor elements 208/210/212/112) and to the monocrystalline semiconductor wafer substrate layer 101 (by the bond anchor elements 102/104/106). In addition to serving as a mechanical anchor of the proof mass 110D to the surrounding frame, the structural connection elements (e.g., 110C, 110E) may also function as a seal ring structure to provide a vacuum seal for the high vacuum cavity 207 when the first MEMS wafer device 100 and first cap wafer structure 200 are bonded together, such as by using a eutectic bonding process. In addition or in the alternative, the structural connection elements (e.g., 110A, 110F) may also function as bond ring structures which are formed to fixedly couple the first MEMS wafer device 100 to the first cap wafer structure 200 across metal bond anchor elements 208/210/212/112) and to the monocrystalline semiconductor wafer substrate 101 (by the metal bond anchor elements 106/104). In addition or in the alternative, the structural connection elements (e.g., 110B, 110E) may also function as electrical interconnect structures which provide an electrical connection between one part of the circuit in the first MEMS wafer device 100 and another circuit in the first cap wafer structure 200.

In similar fashion, the second depicted sensor may be formed in a different layer of the vertically stacked MEMS device wafer assembly 1 with a monocrystalline MEMS proof mass 101B that is aligned with a cavity 302 in the second cap wafer structure 300 and suspended above the polycrystalline semiconductor wafer substrate 110 by, for example, one or more suspension springs (not shown). By attaching the second cap wafer structure 300 to the monocrystalline semiconductor wafer layer 101 as a protective structure over at least the monocrystalline MEMS proof mass 101B, the second depicted sensor may be physically protected from environmental conditions. In addition, the second depicted sensor may be coupled to one or more structural connection elements 101A, 101C formed in the monocrystalline semiconductor wafer layer 101 which are fixedly coupled to the second cap wafer structure 300 (by the patterned bond anchor elements 304, 306) and to the polycrystalline semiconductor wafer substrate layer 110 (by the bond anchor elements 102/104/106). In addition to serving as a mechanical anchor of the proof mass 101B to the surrounding frame, the structural connection elements (e.g., 101A, 101C) may also function to provide an electrical connection to ground the second cap wafer structure 300 to the rest of the first MEMS wafer device 100 and first cap wafer structure 200.

Though shown in simplified cross section view, it will be appreciated that the vertically stacked MEMS device wafer assembly 1 may also include one or more non-illustrated moving electrodes and one or more non-illustrated fixed electrodes. The moving electrodes may form part of the suspended sensor structures 110D, 101B, and the fixed electrodes may be fixedly coupled to the polycrystalline semiconductor wafer layer 110 and/or monocrystalline semiconductor wafer layer 101. The specific structure and configuration of the MEMS sensor may vary. Moreover, a description of the specific structure and configuration of the MEMS sensor is not needed to enable or fully describe present invention, and will thus not be further described in more detail.

Having described an embodiment of a vertically stacked MEMS device wafer assembly 1 from a structural standpoint, an example process sequence for fabricating the vertically stacked MEMS device wafer assembly 1 will now be described with reference to FIGS. 2-7. While the depicted process sequence is provided with reference to making the vertically stacked MEMS device wafer assembly 1 shown in FIG. 1, it will be appreciated that the process is applicable to any one of numerous other MEMS devices, and that there are additional process steps (such as the specific process steps for including an anti-stiction layer or a Bettering layer to the process) that are not be described, as these may be formed using any one of numerous processes, now known or developed in the future. Moreover, although for convenience the method is described using a particular order of steps, portions of the method could be performed in a different order or using different types of steps than what is described below.

Figure 2:
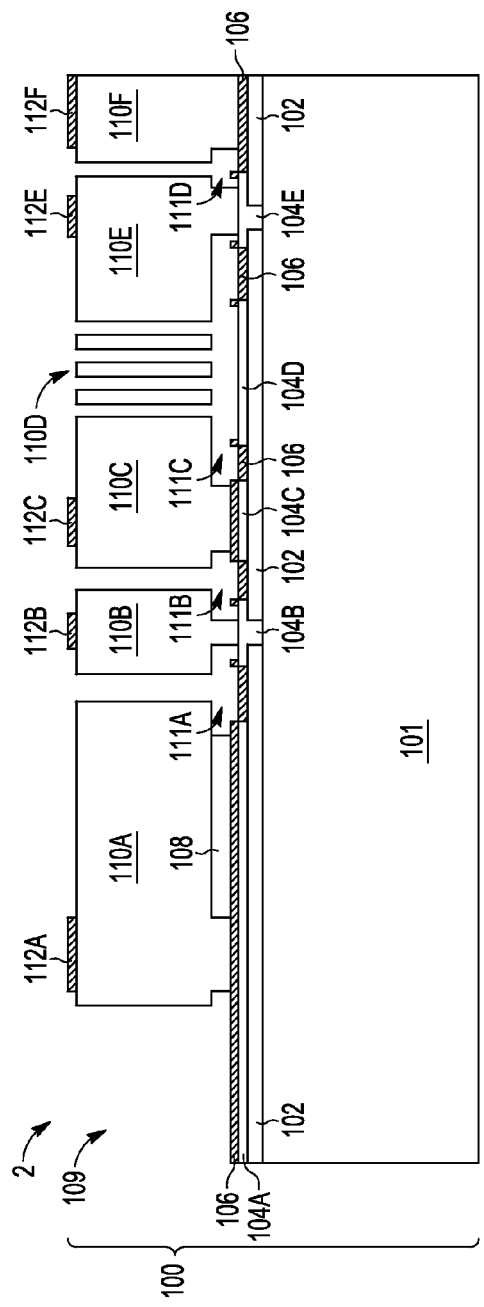
FIGS. 2-7 are simplified cross section views of the multi-sensor MEMS device shown in FIG. 1 to illustrate various exemplary fabrication steps for making the multi-sensor MEMS device in accordance with selected embodiments of the present invention.
Figure 3:
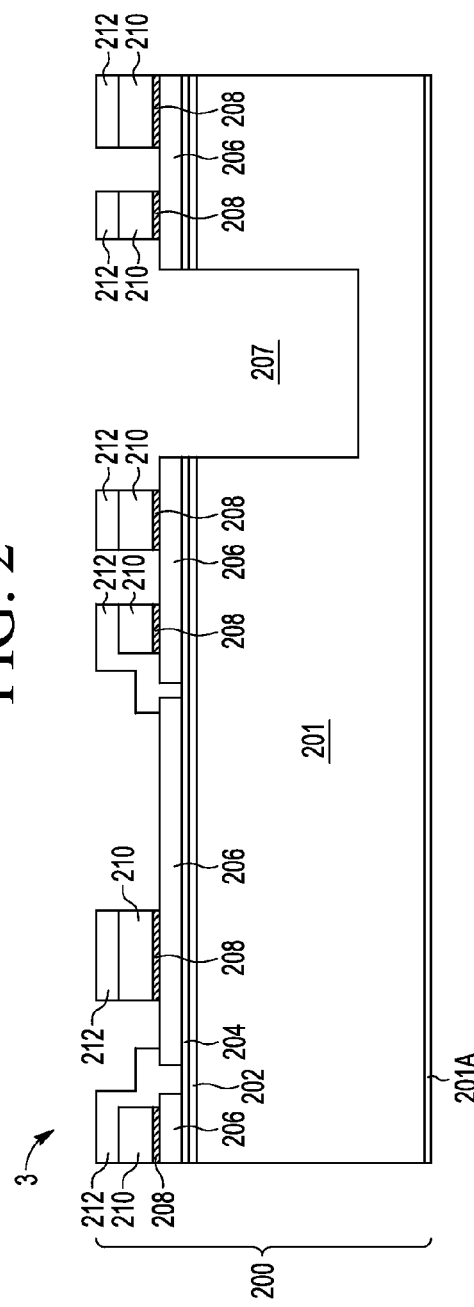
Figure 4:
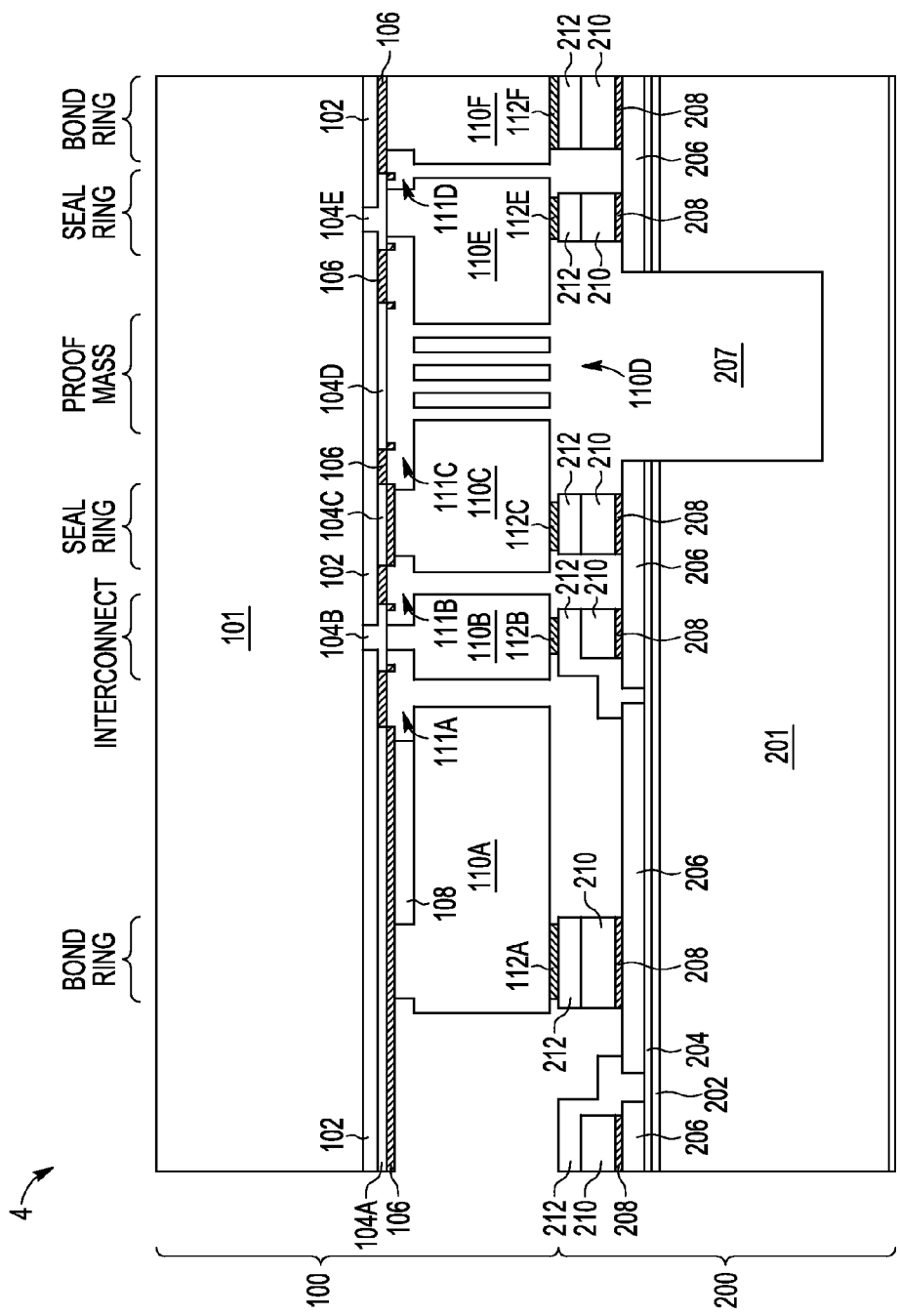

FIGS. 2-4 schematically illustrate the formation of a first MEMS wafer device 100. Referring first to FIG. 2, there is shown a partial cross-sectional view of a handling wafer structure 2 which includes a first substrate 101 and a plurality of defined insulator layers 102, 106, 108, conductor layers 104, polycrystalline semiconductor layers 110, and patterned bond anchor elements 112 that are formed and patterned over the first substrate 101. Depending on the type of device being fabricated, the first substrate 101 may be implemented with monocrystalline semiconductor material, such as a bulk insulator substrate, a bulk metal substrate, a bulk silicon substrate, single crystalline silicon (doped or undoped), semiconductor-on-insulator (SOI) substrate, a multi-layered composite film wafer substrate or any semiconductor material including, for example, Si, SiC, SiGe, SiGeC, Ge, GaAs, InAs, InP as well as other Group III-IV compound semiconductors or any combination thereof. Though not shown, one or more alignment mark(s) can be formed in the first substrate 101 to assist with pattern etching using any desired marking process.

On a first or top surface of the first substrate 101, a first insulator layer 102 is formed (e.g., grown or deposited). in selected embodiments, the surface of the first substrate 101 is cleaned and a thin (e.g., 2 um) layer of oxide is thermally grown to passivate the first substrate 101 and to serve an etch stop for future structural silicon etch processing (described hereinbelow). In addition or in the alternative, a field oxide layer, local oxidation of silicon (LOCOS), or oxide-nitride-oxide (ONO) layer may be formed. Thus, the insulator layer 102 may be implemented as silicon dioxide or some low-k dielectric material, but may include other materials such as phosphor-silicate glass (PSG) oxide, fluorinated silicon glass (FSG) oxide, silicon nitride, and/or other types of dielectric, including low-K dielectric materials with high thermal conductivity for cooling.

If desired, the first insulator layer 102 may be patterned and selectively etched to form one or more openings to expose the first substrate 101. Though not shown, a patterned masking layer may be formed over the insulator layer 102, and any desired etching technique may be used to form the opening in the insulator layer 102 that expose the first substrate 101. The defined openings in the insulator layer 102 may provide an electrical interconnect path to the substrate 101 or otherwise define grounding contact regions to the first substrate 101 for a subsequently formed bond ring structure.

After forming the insulator layer 102, a first conductive layer 104 may be formed, such as by depositing a metal or conductive polysilicon layer on the semiconductor wafer structure 2. In selected embodiments, the first conductive layer 104 is deposited on the patterned insulator layer 102 and exposed first substrate 101 using any desired deposition or sputtering process, such as chemical vapor deposition (CVD), plasma-enhanced chemical vapor deposition (PECVD), physical vapor deposition (PVD), atomic layer deposition (ALD), molecular beam deposition (MBD) or any combination(s) thereof. A suitable material for use as the first conductive layer 104 is doped polysilicon or aluminum which may be deposited to a predetermined thickness of less than 5 microns (e.g., 2-4 microns), though other conductive materials with different thicknesses may be used. The first conductive layer 104 may be patterned and etched to define electrode, interconnect, and bond ring structures on the first MEMS wafer device 100. In particular, a patterned resist or mask layer (not shown) may be formed on the deposited first conductive layer 104 to protect predetermined portions of the first conductive layer 104, and the exposed portions of the first conductive layer 104 are selectively etched and removed, thereby leaving portions of the first conductive layer 104, including interconnect conductors 104A, interconnect substrate contacts 104B, 104E to the substrate 101, structural connection elements 104C, and sensor electrode structures 104D in the movable mass or proof mass area. The pattern transfer and etching of the first conductive layer 104 may use one or more etching steps to remove the unprotected portions of the first conductive layer 104, including a dry etching process such as reactive-ion etching, ion beam etching, plasma etching or laser etching, a wet etching process wherein a chemical etchant is employed or any combination thereof.

After forming the patterned first conductive layer 104, a second insulator layer 106 may be formed, such as by depositing a layer of field nitride or alumina ($Al_2O_3$) over the semiconductor wafer structure 2 to cover the patterned first conductive layer 104, followed by formation of a sacrificial support layer 108 to cover the semiconductor wafer structure 2. In selected embodiments, the sacrificial support layer 108 may be formed by depositing and planarizing a layer of tetra-ethyl ortho-silicate (TEOS) or silane-based oxide over the semiconductor wafer structure 2 to cover the first conductive layer 104 and the patterned openings therein. In addition, a chemical mechanical polish process or other planarization step may be applied to planarize the sacrificial support layer 108. Over intended contact regions, the sacrificial support layer 108 may be selectively etched to expose the underlying second insulator layer 106 or first conductive layer 104 using any desired pattern and etch technique.

On a first or top surface of the sacrificial support layer 108, a second wafer substrate layer 110 is formed (e.g., grown or deposited). In selected embodiments, the second wafer substrate layer 110 is formed by depositing a polycrystalline semiconductor material to a predetermined thickness to serve as the first semiconductor layer in which a first MEMS transducer is formed. For example, the second wafer substrate layer 110 may be formed on the semiconductor structure 2 by blanket-depositing a layer of polysilicon or silicon germanium (SiGe) or silicon carbide (SiC) using chemical vapor deposition (CVD), plasma-enhanced chemical vapor deposition (PECVD), physical vapor deposition (PVD), atomic layer deposition (ALD), or any combination(s) thereof to a thickness of approximately 30 microns, though a thinner or thicker layer may also be used. In other embodiments, the second wafer substrate layer 110 may be formed with a monocrystalline semiconductor material to a predetermined thickness to serve as the first semiconductor layer in which the first MEMS transducer is formed. For example, the second wafer substrate may be formed as the moncrystalline silicon layer of a silicon-on-insulator (SOI) wafer or may be formed by using other wafer bonding techniques which would include fusion, eutectic or metal thermocompression bonding. In addition, a recess or polish process may be applied to thin the deposited second wafer substrate or poly layer 110 down to a predetermined thickness (e.g., approximately 25 microns), though other thicknesses may be desired.

After forming the second wafer substrate or poly layer 110, one or more selective etch processes are applied to form the interconnect, bond, and seal ring structures, as well as the MEMS transducer elements, such as any mechanical elements in the MEMS sensor (e.g., a gyroscope sensor). For example, after forming a patterned transducer resist or mask layer (not shown) to protect selected portions of the second wafer substrate or poly layer 110, the exposed portions may be selectively etched and removed with a deep reactive ion etch (DRIE) process. The selective etch of the second wafer substrate or poly layer 110 also forms an opening which will expose the bond pad area 109 in the finally formed MEMS device wafer assembly. While the second wafer substrate or poly layer 110 may be structurally etched using a DRIE process to define the active layer elements 110A-110F, it will be appreciated that any desired pattern and etching processes may be used, including application and patterning of photoresist directly on the second wafer substrate or poly layer 110. In selected embodiments, the structural etch process is selected that is suitable for croaking high-ratio features. After the structural etch of the second wafer substrate or poly layer 110 is performed, one or more release etch processes are applied to selectively remove exposed portions of the sacrificial support layer 108 and form electrode openings 111A-D, thereby defining all of the component parts of the MEMs sensor device. These component parts include the structural connection elements (e.g., 110B) and the bond ring structures (e.g., 110A, 110F) which are fixedly coupled to the monocrystalline semiconductor wafer substrate 101. The component parts also include the seal ring structures (e.g., 110C, 110 E) which are fixedly coupled to the monocrystalline semiconductor wafer substrate 101 to surround the polycrystalline MEMS proof mass 110D. Finally, the component parts include the mechanical elements 110D of the MEMS sensor device, such as one or more proof mass structures, plates, flexures, frame, and hinges (not shown). In selected embodiments, the release etch process may include a vapor release etch (VPE) which is applied to remove the sacrificial support layer 108 from below the MEMS proof mass 110D, thereby releasing these elements. The release etch process also removes part of the sacrificial support layer 108 as part of the opening which will expose the bond pad area 109 in the finally formed MEMS device wafer assembly.

Before or after etching the second wafer substrate or poly layer 110 and releasing the MEMS proof mass 110D, patterned bond anchor elements 112A-C, 112E-F may be formed on the top surface of the semiconductor wafer structure 2. In selected embodiments, the patterned bond anchor elements 112A-C, 112E-F are formed as patterned germanium anchor elements by depositing a layer of germanium 112 on the semiconductor wafer structure 2. To this end, the top surface of the semiconductor wafer structure 2 may be cleaned, and then a layer of germanium may be formed and then patterned and etched using the patterned resist or mask layer (not shown) to define germanium interconnect structures 112A-C, 112E-F in the interconnect, bond ring, and seal ring areas. If formed before etching the second wafer substrate or poly layer 110, the depositing germanium layer 112 may be covered by a patterned hardmask layer (e.g., TEOS) that is used to bath etch the germanium layer 112 and protect the resulting patterned germanium bond anchor elements 112A-C, 112E-F during subsequent etching of the second wafer substrate or poly layer 110.

FIG. 3 schematically illustrates the formation of a first cap wafer structure 200 which may be used to route signal and/or reference voltage(s) to and from the vertically stacked MEMS device wafer assembly. In other embodiments, the protection and routing function of the first cap wafer structure 200 may be implemented with an application specific integrated circuit for driving and sensing motion of the MEMS sensor elements. However, in the embodiment shown in FIG. 3 with the partial cross-sectional view 3, the first cap wafer structure 200 includes a second substrate 201 and a plurality of defined insulator layers 202, 206, 208, 210, and conductor layers 204, 212 that are formed and patterned over the second substrate 201. Depending on the type of device being fabricated, the second substrate 201 may be implemented with monocrystalline semiconductor material, such as a bulk insulator substrate, a bulk metal substrate, a bulk silicon substrate, single crystalline silicon (doped or undoped), semiconductor-on-insulator (SOI) substrate, a multi-layered composite film wafer substrate or any semiconductor material including for example, Si, SiC, SiGe, SiGeC, Ge, GaAs, InAs, InP as well as other Group III-IV compound semiconductors or any combination thereof. On a backside of the second substrate 201, a protective insulator layer 201a may be formed, such as by thermally growing an oxide layer 201a (e.g., silicon oxide) to a predetermined thickness.

To fabricate the first cap wafer structure 200, a first insulator layer 202 is formed (e.g., grown or deposited) on a first or top surface of the second substrate 201, such as by cleaning the surface of the second substrate 201 and then thermally growing a thin (e.g., 2 um) layer of passivation oxide or other insulator material, such as PSG oxide, FSG oxide, silicon nitride, and/or other types of dielectric, including low-K dielectric materials with high thermal conductivity for cooling.

In addition, the first insulator layer 202 may be patterned and selectively etched to form one or inure openings to expose the second substrate 201. For example, a patterned masking layer (not shown) may be formed over the insulator layer 202, and a selective etch process may be applied to form openings in the insulator layer 202 that expose the second substrate 201 which provide an electrical interconnect path to conductive lines or paths (not shown) in the substrate 201.

After forming the insulator layer 202, a first conductive layer 204 may be formed by depositing a metal or conductive polysilicon layer on the semiconductor wafer structure 3 using any desired deposition or sputtering process, such as CVD, PECVD, PVD, ALD, MBD or any combination(s) thereof. Once deposited, the first conductive layer 204 may be patterned and etched to define electrode, interconnect, and bond ring structures on the first cap wafer structure 200. For example, a patterned resist or mask layer (not shown) may be formed to protect predetermined portions of the first conductive layer 204 and exposed portions of the first conductive layer 204 may be selectively etched and removed, thereby leaving portions of the first conductive layer 204, including interconnect conductors 204A and interconnect substrate contacts 204B to the substrate 201, though other patterned conductive layers (e.g., interconnect structures and sensor electrode structures) may also be formed. The pattern transfer and etching of the first conductive layer 204 may use one or more etching steps to remove the unprotected portions of the first conductive layer 204, including a dry etching process such as reactive-ion etching, ion beam etching, plasma etching or laser etching, a wet etching process wherein a chemical etchant is employed or any combination thereof.

After forming the patterned first conductive layer 204, a second insulator layer 206 may be formed, such as by depositing one or more interlayer dielectric (ILD) layers over the semiconductor wafer structure 3 to a predetermined thickness. In selected embodiments, the second insulator layer 206 may be formed by depositing and planarizing a first cap oxide layer 206 over the semiconductor wafer structure 3 to cover the first conductive layer 204 and the patterned openings therein. Subsequently, a cap etch stop layer 208 (e.g., silicon nitride) and second cap oxide layer 210 are sequentially deposited, patterned, and etched to form patterned standoff elements 208/210 which are positioned for alignment with the patterned bond anchor elements 112A-C, 112E-F during bonding. In addition, one or more patterned etch processes may be applied to selectively etch the first cap oxide layer 206 and expose the underlyling first conductive layer 204 at predetermined via openings.

In preparation for bonding, patterned cap metal bond anchor elements 212 are formed on the semiconductor wafer structure 3. For example, when the metal bond anchor elements 212 are formed with patterned aluminum, an aluminum layer may be deposited or sputtered to a predetermined thickness (e.g., 2-4 microns), though other deposition processes, materials, and thicknesses may be used. Once deposited, a photolithographic mask and etch processing is applied to define the aluminum bond anchor elements 212 which are positioned in the bond pad area and for alignment with the patterned bond anchor elements 112A-C, 112E-F from the first MEMS wafer device 100. While FIG. 3 shows two patterned interconnect layers 210, 212 are formed on the first cap wafer structure 200, those skilled in the art will appreciate that the first cap wafer structure 200 may also be formed with additional (three or more) or fewer (one) electrical interconnect layers.

Before or after formation of the patterned cap metal bond anchor elements 212, a cap cavity 207 may be formed in the second substrate 201 by patterning and etching the semiconductor wafer structure 3. For example, a patterned cap resist or mask layer (not shown) may be formed to expose and remove the cap oxide layer 206 over the intended cap cavity 207, followed by selectively removal of the exposed portions of the second substrate 201 to form a cap cavity 207 to a predetermined depth and width which is positioned for alignment with the patterned polycrystalline MEMS proof mass 110D from the first MEMS wafer device 100. The pattern transfer and etching of the second substrate 201 may use one or more silicon etching steps, including a dry etching process such as reactive-ion etching, ion beam etching, plasma etching or laser etching, a wet etching process wherein a chemical etchant is employed or any combination thereof.

FIG. 4 illustrates processing of the multi-sensor MEMS device as a semiconductor wafer structure 4 after the first MEMS wafer device 100 (FIG. 2) has been flipped upside down and bonded to the first cap wafer structure 200 (FIG. 3). In preparation for bonding, the first MEMS wafer device 100 and the first cap wafer structure 200 may each be cleaned, such as by using an non-oxidizing ash chemistry or solvent-based wet removal process which does not oxidize the underlying metal layers. In selected embodiments, the first MEMS wafer device 100 and the first cap wafer structure 200 are bonded together using metal compression bonding techniques, such as a combination of thermal and pressure bonding. For example, when the bond anchor elements 212 and 112A-C, 112E-F are formed with patterned aluminum, the aluminum layers may be bonded together using thermocompression bonding whereby the anchor elements are aligned in contact while heat and compression is applied to bond the aligned anchor elements to one another. In selected example embodiments, thermocompression bonding may be implemented by applying pressure at or above a predetermined threshold (e.g., 30 MPa) in combination with a relatively low temperature heat process (e.g., at or below 500 degrees Celsius). For example, aluminum thermocompression bonding may be implemented by aligning and compressing the first MEMS wafer device 100 and first cap wafer structure 200 with 70-90 kiloNewtons of force while heating the wafer structures 100, 200 to 400-500 degrees Celsius for approximately 30-50 minutes. By attaching the first MEMS wafer device 100 to the first cap wafer structure 200 using a metal-to-metal bond technique, the MEMS transducer structures formed from the first MEMS wafer device 100 can be hermetically sealed by the bonding and seal ring structures 208/210/212/112/110/106/104.

The metal thermocompression bonding techniques described hereinabove provide a hermetic barrier between the MEMS transducer structures 110D (formed from the first MEMS wafer device 100) and the ambient environment which is superior to the sealing performance provided by oxide or glass sealing techniques. However, it is contemplated that other bonding techniques may be used to obtain additional sealing protections. For example, it may be desired to obtain a high vacuum environment in the cavity 207 when the first MEMS sensor is formed as a gyroscope sensor mass. In such cases, instead of using thermocompression bonding techniques to bond the aligned aluminum bond anchor elements 212 and 112A-C, 112E-F, the bond anchor elements 112A-C, 112E-F are replaced with patterned germanium anchor elements 112A-C, 112E-F so that an aluminum-germanium eutectic bond may be formed to bond the first MEMS wafer device 100 and the first cap wafer structure 200 together. To this end, the protective first cap wafer structure 200 and first MEMS wafer device 100 are bonded together using an aluminum-germanium eutectic bond under vacuum conditions. As a result, the high aspect ratio polycrystalline MEMS proof mass structures 110D formed from the first MEMS wafer device 100 can be hermetically sealed.

Figure 5:
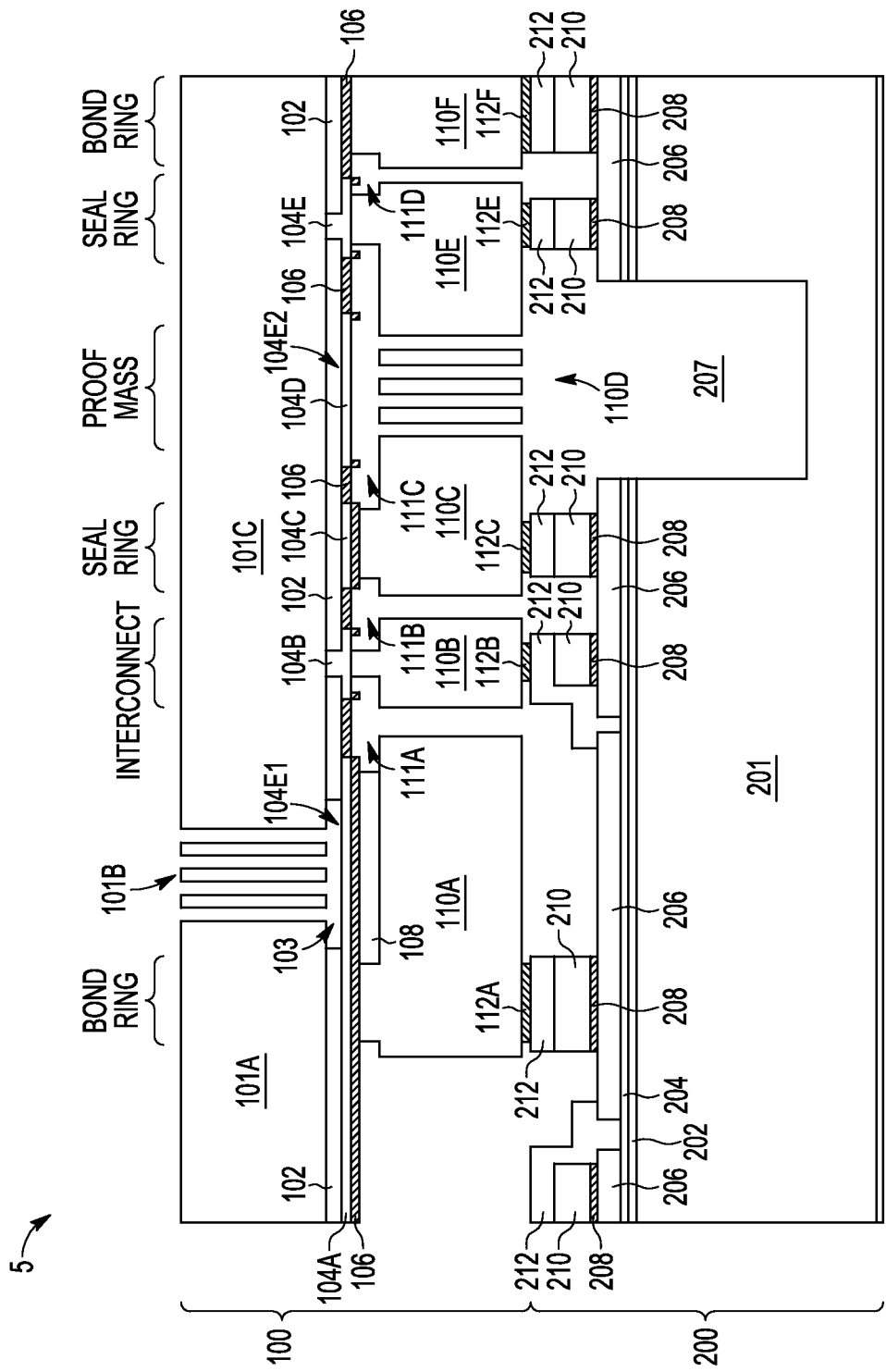

FIG. 5 illustrates processing of a semiconductor wafer structure 5 subsequent to FIG. 4 after the monocrystalline semiconductor wafer substrate 101 of the first MEMS wafer device 100 is thinned, patterned, and etched to form a second MEMS sensor (e.g., a linear accelerometer sensor) over one or more out-of-plane sensing electrodes 104E1 that are integrated with the first MEMS wafer device 100. Either before or after bonding the first MEMS wafer device 100 and the first cap wafer structure 200, the monocrystalline semiconductor wafer substrate 101 may be thinned to a thickness of about 25 microns, or to any desired thickness that allows a high aspect ratio MEMS transducer element to be formed therefrom. Conventional grinding and polishing is a suitable method for performing this thinning step. The thinning of monocrystalline semiconductor wafer substrate layer 101 can be done uniformly, or it can be done so that regions of monocrystalline semiconductor wafer substrate 101 that will become MEMS transducer elements (e.g., different proof masses) are thinner or thicker than other parts of wafer substrate layer 101.

Before or after thinning the wafer substrate layer 101, one or more selective etch processes are applied to form the MEMS transducer elements 101B and surrounding frame support elements 101A, 101C, such as any mechanical elements in the MEMS sensor (e.g., a linear accelerometer sensor). For example, after forming a patterned transducer resist or hardmask layer (not shown) to protect selected portions of the thinned wafer substrate layer 101, the exposed portions may be selectively etched and removed with a deep reactive ion etch (DRIE) process. While the thinned wafer substrate layer 101 may be structurally etched using a DRIE process to define the active layer elements 101A-101C, it will be appreciated that any desired pattern and etching processes may be used, including application and patterning of photoresist directly on the thinned wafer substrate layer 101. In selected embodiments, the structural etch process is selected that is suitable for creating high-aspect ratio features. After the structural etch of the second thinned wafer substrate layer 101, one or more release etch processes are applied to selectively remove exposed portions of the underlying first insulator or field oxide layer 102, thereby defining all of the component parts of the second MEMs sensor device. These component parts include the frame or structural connection elements (e.g., 101A, 101C) which are fixedly coupled to the first MEMS wafer device 100, and also include the mechanical elements 101B of the second MEMS sensor device, such as one or more proof mass structures, plates, flexures, frame, and hinges (not shown). In selected embodiments, the release etch process may include a vapor release etch (VPE) which is applied to remove the field oxide layer 102 and form an electrode opening 103 below the MEMS proof mass 101B, thereby releasing these elements and exposing the underlying sensor electrode layer 104E1 which is connected to the interconnect conductor(s) 104A.

Figure 6:
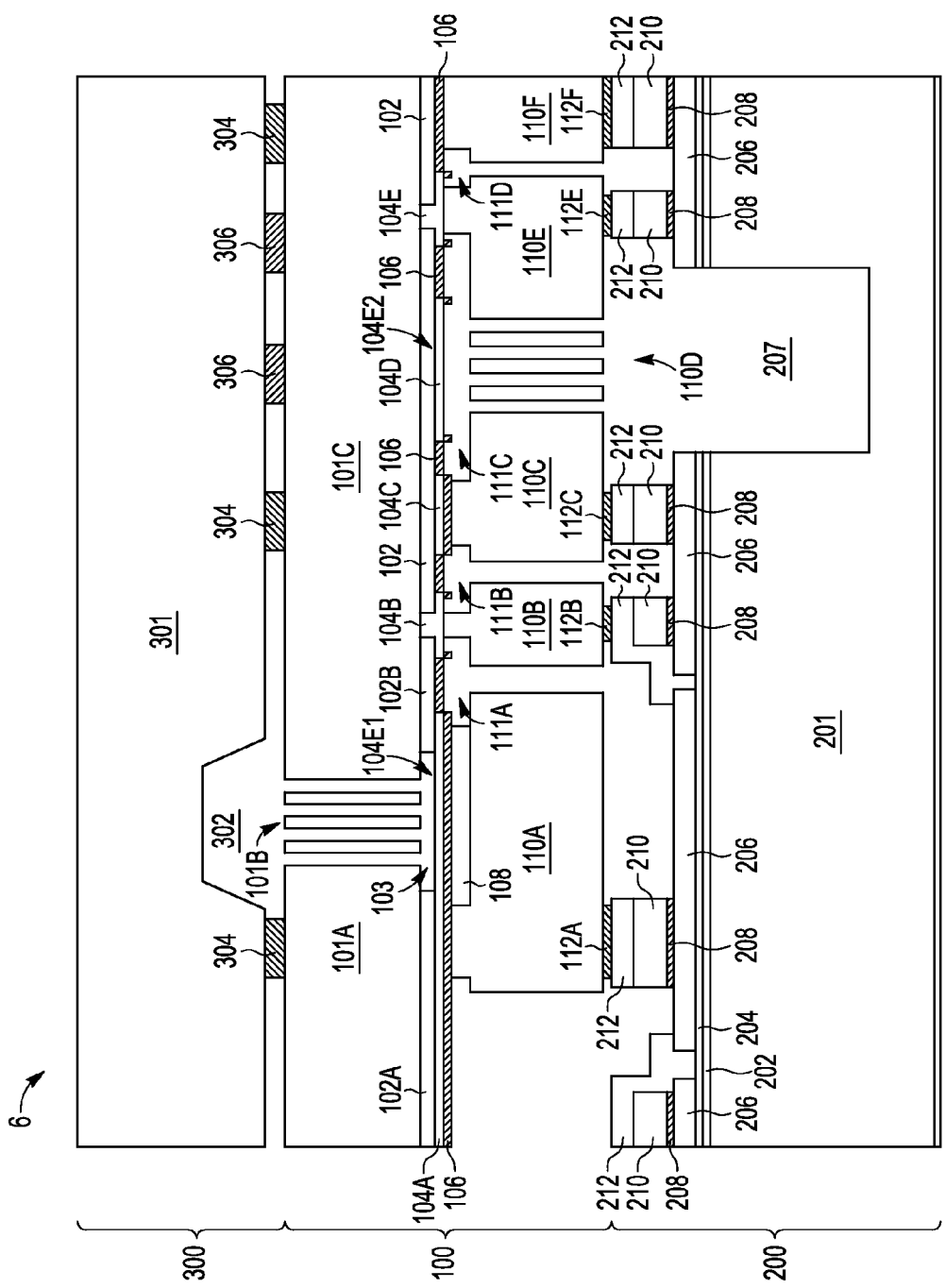
Figure 7:
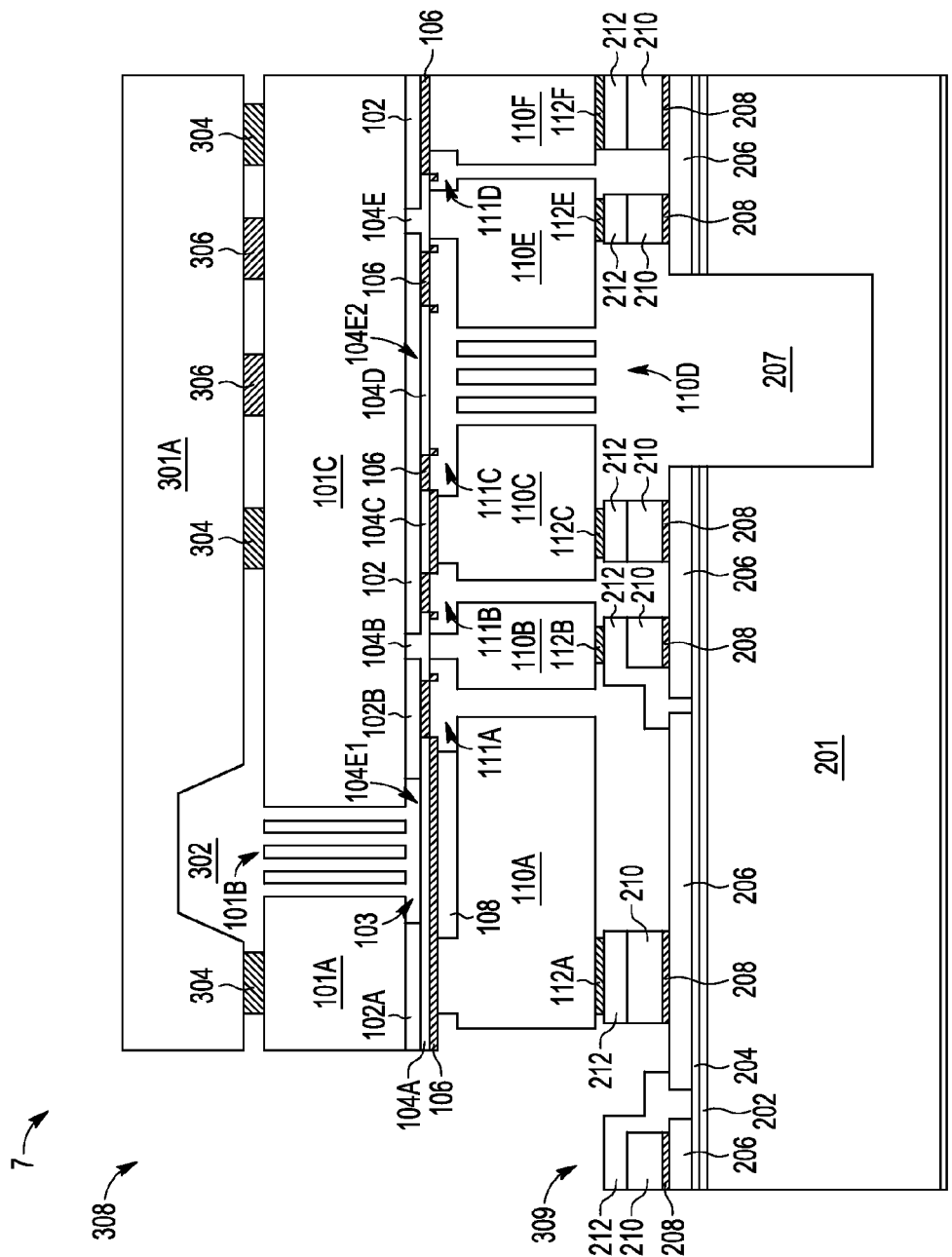

FIGS. 6-7 schematically illustrate processing subsequent to FIG. 5, starting with a partial cross-sectional view 6 of a second cap wafer structure 300 that is attached to the thinned wafer substrate layer 101 of the first MEMS wafer device 100. As illustrated, the second cap wafer structure 300 includes third substrate 301. Depending on the type of device being fabricated, the third substrate 301 may be implemented with monocrystalline semiconductor material, such as a bulk insulator substrate, a bulk metal substrate, a bulk silicon substrate, single crystalline silicon (doped or undoped), semiconductor-on-insulator (SOI) substrate, a multi-layered composite film wafer substrate or any semiconductor material including, for example, Si, SiC, SiGe, SiGeC, Ge, GaAs, InAs, InP as well as other Group compound semiconductors or any combination thereof. In addition, a recess or cavity opening 302 is formed on a bottom surface of the third substrate 301 and positioned for alignment with the MEMS proof mass 101B formed in the thinned wafer substrate layer 101 using any desired selective etch process to a predetermined depth and width.

In preparation for bonding, one or more patterned bond anchor elements 304 are formed on the bond-facing surface of the thinned wafer substrate layer 101 or the second cap wafer structure 300. By patterning one or more patterned frit and/or polymer bond layers 304 on the exposed surface of the thinned wafer substrate layer 101, the second cap wafer 300 may be bonded to the first MEMS wafer device using a lower temperature bonding technique or other metal thermocompression or a eutectic bonding technique, thereby enclosing the second MEMS sensor transducer elements 101B. In addition or in the alternative, one or more patterned conductive bond layers 306 may be formed on the exposed surface of the thinned wafer substrate layer 101 with a conductive material (e.g., aluminum), thereby providing an electrical grounding connection between the second cap wafer structure 300 and the first MEMS wafer device 100.

Before or after bonding the first MEMS wafer device 100 and the second cap wafer structure 300, the third substrate 301 may be thinned to a thickness of about 150 microns, or to any desired thickness, while allowing physical protection of the MEMS transducer elements formed. For example, FIG. 7 illustrates processing of the semiconductor wafer structure 7 after the second cap wafer structure 300 has been thinned to a target thickness. Conventional grinding and polishing is a suitable method for performing this thinning step to achieve a target thickness for the vertically stacked MEMS device wafer assembly. In addition, a saw or other selective etch process may be applied to remove a portion of the third substrate 301 overlying the bond pad area 308, thereby exposing the bond pad electrode(s) 309.

As will be appreciated, additional or different processing steps may be used to complete the fabrication of the depicted vertically stacked MEMS device wafer assembly 7 into functioning devices. In addition to various front end processing steps (such as sacrificial oxide formation, stripping, isolation region formation, implantation, spacer formation, annealing, silicide formation, and polishing steps), additional backend processing steps may be performed, such as forming contact plugs and multiple levels of interconnect(s) that are used to connect the device components in a desired manner to achieve the desired functionality. Thus, the specific sequence of steps used to complete the fabrication of the device components may vary, depending on the process and/or design requirements. It is understood that the terms so used are interchangeable under appropriate circumstances such that the embodiments of the invention described herein are, for example, capable of operation in other orientations than those illustrated or otherwise described herein.

By now, it should be appreciated that there has been provided herein a MS sensor device and associated method for fabricating same. The disclosed MEMS sensor device includes a plurality of vertically-stacked inertial transducer elements, each formed in different layer of a multi-layer semiconductor structure. In selected embodiments, the vertically-stacked inertial transducer elements include a first MEMS sensor (e.g., a gyroscope sensor) formed in a first semiconductor layer (e.g., a polycrystalline semiconductor layer), and a second MEMS sensor (e.g., a linear accelerometer sensor) formed in a second semiconductor layer (e.g., a monocrystalline semiconductor layer) that is stacked over the first semiconductor layer. The disclosed MEMS sensor device also includes at least one cap device bonded to the multi-layer semiconductor structure to protect any exposed inertial transducer element from ambient environmental conditions. In selected embodiments, the at least one cap device includes a first routing cap device bonded to an exposed side of the first semiconductor layer, where the first routing cap device comprises a first sensor cavity that is aligned with the first MEMS sensor. For example, the first routing cap device may be bonded to the exposed side of the first semiconductor layer with a high temperature eutectic seal ring bonding structure to form a vacuum in the first sensor cavity. In this way, the eutectic seal ring bonding structure may be formed as an aluminum-germanium seal ring bonding structure. Alternatively, the first routing cap device may be bonded to the exposed side of the first semiconductor layer using thermocompression bonding. The cap devices also includes a second cap device bonded to an exposed side of the second semiconductor layer, where the second cap device comprises a second sensor cavity that is aligned with the second MEMS sensor. For example, the second cap device may be bonded to the exposed side of the second semiconductor layer with a low temperature frit bonding structure. In addition or in the alternative, the second cap device may be bonded to the exposed side of the second semiconductor layer with an electrically conductive bonding structure to electrically connect the second cap device to the multi-layer semiconductor structure.

In another form, there is provided a method for fabricating a transducer. In the disclosed methodology, a MEMS wafer structure is provided that includes a first semiconductor substrate layer (e.g., a monocrystalline silicon substrate layer) and a second semiconductor layer (e.g., a polysilicon layer) that is formed over the first semiconductor substrate layer and etched to form a first high aspect ratio proof mass MEMS transducer element and surrounding frame support elements. In selected embodiments, the first semiconductor substrate layer is a monocrystalline silicon substrate layer that is etched with a deep reactive ion etch process to form a high aspect ratio sensing subassembly from the monocrystalline silicon substrate layer prior to bonding the second cap wafer structure to the MEMS wafer structure. On a first surface of the second semiconductor layer, a first patterned metal layer (e.g., a patterned germanium layer) is formed to define part of a first sealing ring structure on the surrounding frame support elements. In addition, a first cap wafer structure (e.g., a monocrystalline silicon substrate layer or application specific integrated circuit wafer structure) is provided that includes a second substrate layer and a second patterned metal layer (e.g., a patterned aluminum layer) formed on a first surface of the second substrate layer. After placing the MEMS wafer structure on the first cap wafer structure so that the first and second patterned metal layers are aligned, the MEMS wafer structure is bonded to the first cap wafer structure using a first bonding process to form a bond between the first and second patterned metal layers to thereby form the first sealing ring structure on the surrounding frame support elements to surround the first MEMS transducer element. In selected embodiments, the MEMS wafer structure is bonded to the first cap wafer structure by forming an aluminum-germanium eutectic bond between the first and second patterned metal layers in a vacuum environment, thereby sealing the first MEMS transducer element in a vacuum with the first sealing ring structure. In other embodiments, the MEMS wafer structure is bonded to the first cap wafer structure using a thermocompression bonding process to form the bond between the first and second patterned metal layers. Subsequently, the first semiconductor substrate layer is etched with a deep reactive ion etch process to form a second MEMS transducer element and surrounding frame support elements from the first semiconductor substrate layer. In addition, a second cap wafer structure having a third substrate layer with a sensor cavity is provided and placed on the MEMS wafer structure so that the sensor cavity and second MEMS transducer element are aligned. Once positioned in alignment, the second cap wafer structure is bonded to the MEMS wafer structure using a second bonding process which may be a low temperature frit bonding process for bonding the second cap wafer structure to the MEMS wafer structure.

In yet another form, there is provided a high aspect ratio transducer and method for making same. The transducer includes a first routed cap structure, a first polycrystalline semiconductor substrate structure attached to the first routed cap structure, second monocrystalline semiconductor substrate structure attached to the first polycrystalline semiconductor substrate structure, and a second cap structure attached to the second monocrystalline semiconductor substrate structure. The first routed cap structure includes a substrate, a plurality of first metal interconnect bond spacer structures formed on the substrate, and a high vacuum cavity formed in the substrate to define a first inertial transducer space. The polycrystalline semiconductor substrate structure is attached to the plurality of first metal interconnect bond spacer structures and includes a first high aspect ratio proof mass element which is aligned with the first inertial transducer space. The polycrystalline semiconductor substrate structure also includes a first surface on which a second patterned metallic layer is formed and bonded to the plurality of first metal interconnect bond spacer structures. On a second surface of the polycrystalline semiconductor substrate structure, a plurality of spacer structures is formed to define one or more out-of-plane sensing electrode spaces. The monocrystalline semiconductor substrate structure is attached to the plurality of spacer structures and includes a second high aspect ratio proof mass element. The monocrystalline semiconductor substrate structure include a first surface attached to one or more patterned bonding layers, and a second surface on which one or more out-of-plane sensing electrodes are formed in alignment with the one or more out-of-plane sensing electrode spaces. The second cap structure is attached to the one or more patterned bonding layers and includes a substrate in which a cavity is formed to define a second inertial transducer space which is aligned with the second inertial transducer. In selected embodiments, the first high aspect ratio proof mass element is a MEMS proof mass element of a gyroscope sensor formed in the high vacuum cavity formed with eutectic seal bond between the plurality of first metal interconnect bond spacer structures and the second patterned metallic layer. In addition, the second high aspect ratio proof mass element is a MEMS proof mass element of a linear accelerator sensor form in the second inertial transducer space.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of example MEMS device wafer structures without including every device feature or geometry in order to avoid limiting or obscuring the present invention. In addition, the methodology of the present invention may be applied using materials other than expressly set forth herein. In addition, the process steps may be performed in an alternative order than what is presented. For example, the sequence of wafer bonding steps may be reversed. In addition, it is noted that, throughout this detailed description, certain layers of materials will be deposited and removed to form the depicted MEMS device wafer structures. Where the specific procedures for depositing or removing such layers are not detailed below, any desired technique may be used for depositing, removing or otherwise forming such layers at appropriate thicknesses. Such details are well known and not considered necessary to teach one skilled in the art of how to make or use the present invention. And while the disclosed MEMS devices may be implemented with accelerometer and/or gyroscope sensors, the fabrication process described herein is not limited to such MEMS sensors or any other type of sensor, but is also applicable to any one of numerous MEMS devices that include some type of structure that is movably suspended by one or more springs and that is formed by bonding an active wafer to a reference wafer. Non-limiting examples of such devices include various types of accelerometers and switches, optical MEMS system components, and other MEMS system devices that use drive and sense electrodes. It is also noted that, throughout this detailed description, certain elements in the figures are illustrated for simplicity and clarity and have not necessarily been drawn to scale so that the illustrated dimensions of some of the elements in the figures may be exaggerated relative to other elements to help improve the understanding of the embodiments of the present invention. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements hut may include other elements not expressly listed or inherent to such process, method, article, or apparatus.

What is claimed is:

1. A MEMS sensor device, comprising:
   a plurality of vertically-stacked inertial transducer elements, each formed in different layer of a multi-layer semiconductor structure forming a single integrated circuit device; and
   a cap device bonded to the multi-layer semiconductor structure to protect at least a first exposed inertial transducer element from ambient environmental conditions.

2. The MEMS sensor device of claim 1, where the plurality of vertically-stacked inertial transducer elements comprises:
   a first MEMS sensor formed in a first semiconductor layer; and
   a second MEMS sensor formed in a second semiconductor layer that is stacked over the first semiconductor layer.

3. The MEMS sensor device of claim 2, where the first MEMS sensor comprises a gyroscope sensor formed in a polycrystalline semiconductor layer.

4. The MEMS sensor device of claim 3, where the second MEMS sensor comprises a linear accelerometer sensor formed in a monocrystalline semiconductor layer that is stacked over the polycrystalline semiconductor layer.

5. The MEMS sensor device of claim 2, where the cap device comprises:
   a first routing cap device bonded to an exposed side of the first semiconductor layer, where the first routing cap device comprises a first sensor cavity that is aligned with the first MEMS sensor; and
   a second cap device bonded to an exposed side of the second semiconductor layer, where the second cap device comprises a second sensor cavity that is aligned with the second MEMS sensor.

6. The MEMS sensor device of claim 5, where the first routing cap device is bonded to the exposed side of the first semiconductor layer with a high temperature eutectic seal ring bonding structure to form a vacuum in the first sensor cavity.

7. The MEMS sensor device of claim 6, where the eutectic seal ring bonding structure comprises an aluminum-germanium seal ring bonding structure.

8. The MEMS sensor device of claim 5, where the first routing cap device is bonded to the exposed side of the first semiconductor layer using thermocompression bonding.

9. The MEMS sensor device of claim 5, where the second cap device is bonded to the exposed side of the second semiconductor layer with a low temperature frit bonding structure.

10. The MEMS sensor device of claim 8, where the second cap device is bonded to the exposed side of the second semiconductor layer with an electrically conductive bonding structure to electrically connect the second cap device to the multi-layer semiconductor structure.

11. A method for fabricating a transducer comprising:
    providing a MEMS wafer structure comprising a first semiconductor substrate layer and a second semiconductor layer that is formed over the first semiconductor substrate layer and etched to form a first MEMS transducer element and surrounding frame support elements;
    forming a first patterned metal layer on a first surface of the second semiconductor layer to define part of a first sealing ring structure on the surrounding frame support elements;
    providing a first cap wafer structure comprising a second substrate layer and a second patterned metal layer formed on a first surface of the second substrate layer;
    placing the MEMS wafer structure on the first cap wafer structure so that the first and second patterned metal layers are aligned;
    bonding the MEMS wafer structure to the first cap wafer structure using a first bonding process to form a bond between the first and second patterned metal layers to thereby form the first sealing ring structure on the surrounding frame support elements to surround the first MEMS transducer element;
    etching the first semiconductor substrate layer with a deep reactive ion etch process to form a second MEMS transducer element and surrounding frame support elements from the first semiconductor substrate layer;
    providing a second cap wafer structure comprising a third substrate layer having a sensor cavity;
    placing the second cap wafer structure on the MEMS wafer structure so that the sensor cavity and second MEMS transducer element are aligned; and
    bonding the second cap wafer structure to the MEMS wafer structure using a second bonding process.

12. The method of claim 11, where providing the MEMS wafer structure comprises providing a first monocrystalline silicon substrate layer over which is formed a second polysilicon layer comprising a first high aspect ratio proof mass transducer element and surrounding frame support elements.

13. The method of claim 12, where forming the first patterned metal layer comprises forming a patterned germanium layer on the second polysilicon layer.

14. The method of claim 13, where providing the first cap wafer structure comprises providing a monocrystalline silicon substrate layer or application specific integrated circuit wafer structure over which the second patterned metal layer is formed as a patterned aluminum layer.

15. The method of claim 14, where bonding the MEMS wafer structure to the first cap wafer structure comprises forming an aluminum-germanium eutectic bond between the first and second patterned metal layers in a vacuum environment, thereby sealing the first MEMS transducer element in a vacuum with the first sealing ring structure.

16. The method of claim 11, where etching the first semiconductor substrate layer comprises etching a monocrystalline silicon substrate layer with a deep reactive ion etch process to form a high aspect ratio sensing subassembly from the monocrystalline silicon substrate layer prior to bonding the second cap wafer structure to the MEMS wafer structure.

17. The method of claim 11, where second bonding process comprises a low temperature frit bonding process for bonding the second cap wafer structure to the MEMS wafer structure.

18. The method of claim 11, where bonding the MEMS wafer structure to the first cap wafer structure comprises using a thermocompression bonding process to form the bond between the first and second patterned metal layers.

19. A high aspect ratio transducer, comprising:
   a first routed cap structure comprising a substrate, a plurality of first metal interconnect bond spacer structures, and a high vacuum cavity formed in the substrate to define a first inertial transducer space;
   a first polycrystalline semiconductor substrate structure attached to the plurality of first metal interconnect bond spacer structures and comprising a first high aspect ratio proof mass element which is aligned with the first inertial transducer space, the first polycrystalline semiconductor substrate structure comprising:
      a first surface on which a second patterned metallic layer is formed and bonded to the plurality of first metal interconnect bond spacer structures, and
      a second surface on which a plurality of spacer structures are formed to define one or more out-of-plane sensing electrode spaces;
   a second monocrystalline semiconductor substrate structure attached to the plurality of spacer structures and comprising a second high aspect ratio proof mass element, the second monocrystalline semiconductor substrate structure comprising:
      a first surface attached to one or more patterned bonding layers, and
      a second surface on which one or more out-of-plane sensing electrodes are formed in alignment with the one or more out-of-plane sensing electrode spaces; and
   a second cap structure attached to the one or more patterned bonding layers and comprising a substrate in which a cavity is formed to define a second inertial transducer space which is aligned with the second inertial transducer.

20. The high aspect ratio transducer of claim 19, where the first high aspect ratio proof mass element comprises a MEMS proof mass element of a gyroscope sensor formed in the high vacuum cavity formed with eutectic seal bond between the plurality of first metal interconnect bond spacer structures and the second patterned metallic layer, and where the second high aspect ratio proof mass element comprises a MEMS proof mass element of a linear accelerator sensor form in the second inertial transducer space.

* * * * *